United States Patent [19]

Aitken

[11] Patent Number: 4,782,304
[45] Date of Patent: Nov. 1, 1988

[54] SYSTEMS AND METHDS FOR ION BEAM ACCELERATION

[75] Inventor: Derek Aitken, South Holmwood, England

[73] Assignee: Applied Materials, Inc., Santa Clara, Calif.

[21] Appl. No.: 898,389

[22] Filed: Aug. 20, 1986

[51] Int. Cl.$^4$ .................. H01J 37/04; H01J 37/317
[52] U.S. Cl. ............................... 328/233; 313/360.1; 250/423 R; 250/429.3
[58] Field of Search ................. 315/111.81; 328/233; 313/360.1, 361.1, 230; 250/423 R, 492.21, 492.23

[56] References Cited

U.S. PATENT DOCUMENTS 3,731,211 5/1973 Purser .................... 313/361.1 X
4,578,589 3/1986 Aiken .......................... 250/281 X Primary Examiner—David K. Moore
Assistant Examiner—K. Wieder
Attorney, Agent, or Firm—Flehr, Hohbach, Test, Albritton & Herbert

[57] ABSTRACT

A system for post analysis acceleration of an ion beam to a selected energy without beam blow-up. A group of electrodes extablish a non-linear voltage gradient along the beam axis for accelerating and then decelerating the beam to the selected energy level with focusing.

23 Claims, 5 Drawing Sheets

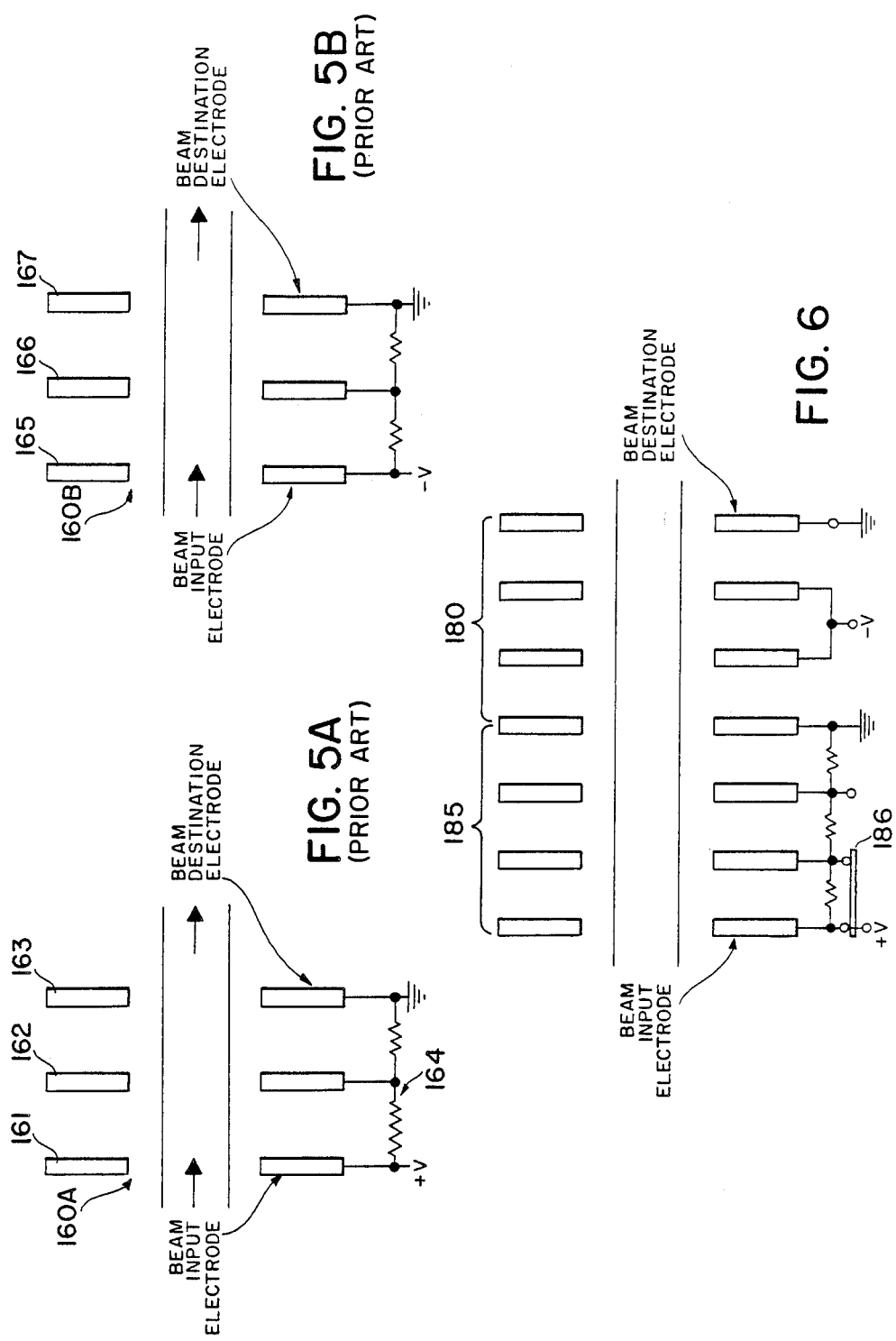

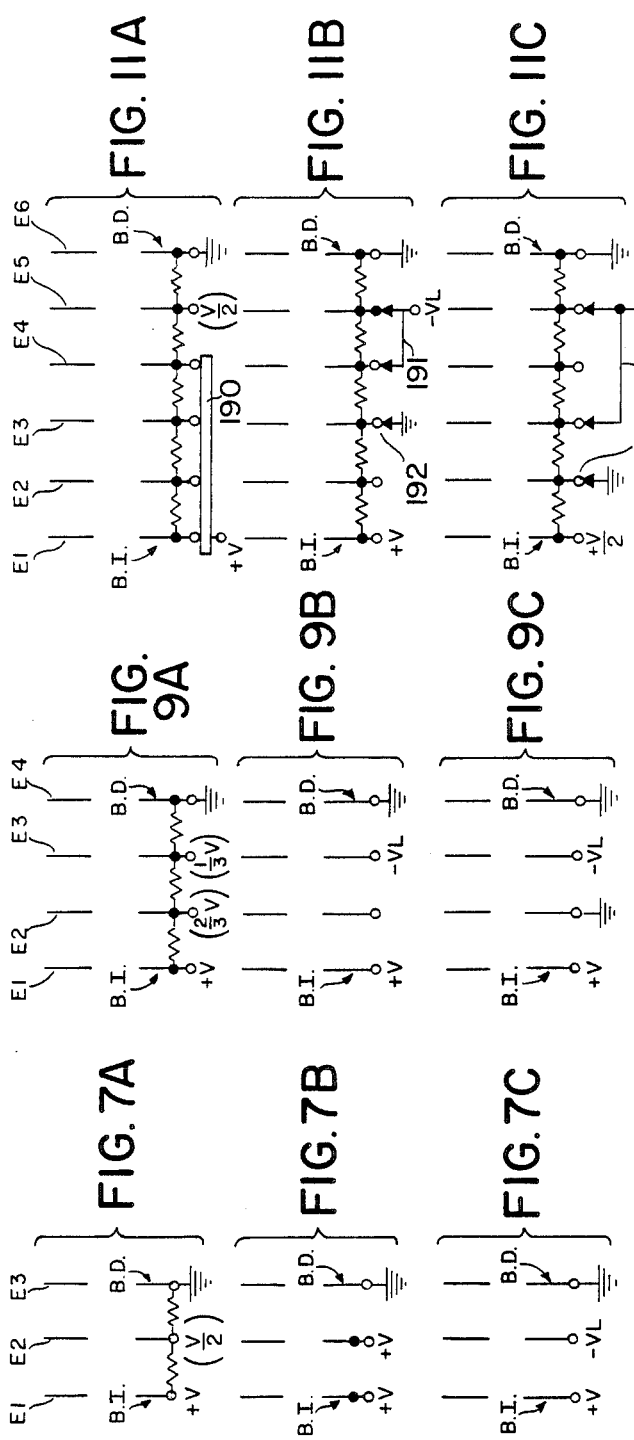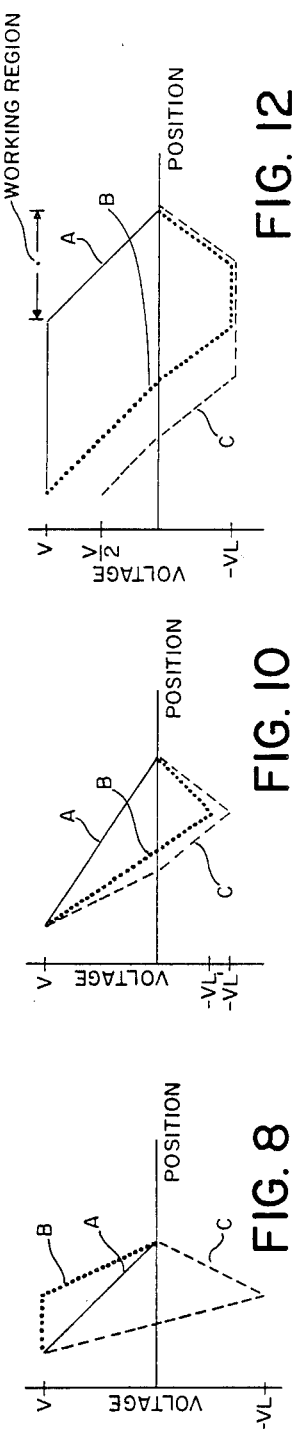

SYSTEMS AND METHODS FOR ION BEAM ACCELERATION

FIELD OF THE INVENTION

This invention relates generally to systems and methods for accelerating ion beams. More specifically, this invention relates to systems and methods for post acceleration of ion beams as a part of systems and methods for implanting conductivity modifying chemical impurities into semiconductor wafers which are employed in processes for manufacturing semiconductor devices such as large scale integrated circuit chips. The invention will be described in terms of its application to ion implantation of semiconductor wafers, but it should be understood that the invention is applicable generally to the acceleration of ion beams.

BACKGROUND OF THE INVENTION

Use of Ion Implantation in Semiconductor Processing

Very great improvements in the scale of integration of semiconductor devices on integrated circuit (IC) chips and the speed of operation of such devices have been achieved over the past several years. These improvements have been made possible by a number of advances in integrated circuit manufacturing equipment as well as improvements in the materials and methods utilized in processing virgin semiconductor wafers into IC chips. The most dramatic advances in manufacturing equipment have been improved apparatus for lithography and etching and improved systems for implanting ions of conductivity modifying impurities into the semiconductor wafer.

Generally, the density of integrated circuits and their speed of operation are dependent largely upon the accuracy and resolution of the lithography and etching apparatus used to form patterns of circuit elements in masking layers on the semiconductor wafer. However, density and speed are also dependent upon tight control of the profile of doped regions in the wafer, i.e., regions to which substantial concentrations of conductivity modifying impurities have been added. Tight control of wafer doping can best be achieved using ion implantation techniques and equipment.

Large scale integration (LSI) and very large scale integration (VLSI) of conductor-insulator-silicon (CIS) devices are improved by making more efficient use of the wafer area, shortening interconnects between devices, producing smaller geometries and reducing noise. All of these improvements are made possible in large part through the use of ion implantation doping methods.

Manufacture of bipolar circuits has also been improved with ion implantation. In this processing technology, improvements have resulted from performing predepositions with ion implantation and simultaneously taking advantage of the low contamination and compatibility with photoresist masking which are characteristics of ion implantation equipment.

It is well-known in the industry that doping small geometric regions of a semiconductor wafer cannot be done adequately with gaseous or spin-on deposition of the dopant material on the surface of the wafer, followed by a high temperature furnace diffusion operation which drives the dopant material into the semiconductor wafer in an isotropic manner, i.e., the dopant molecules travel laterally as well as vertically into the wafer. The kinds of dopant profiles, concentrations and lateral geometries required on an LSIC or VLSIC wafer make ion implantation the doping process of choice. The uniformity of doping achievable only with ion implantation is critical in the fabrication of smaller geometry devices. In addition, doping uniformity across the wafer and repeatability from wafer to wafer, which is achievable with ion implantation, dramatically improves fabrication yields of high density devices.

Example of Use of Ion Implantation

FIGS. 1–3 illustrate the use of a sequence of ion implantation steps in fabricating conductor-insulator-silicon (CIS) integrated circuits devices on a semiconductor wafer. FIG. 1 illustrates a first ion implantation step which may be performed on the P-type wafer 10 to produce a light implant in the field regions of the wafer. The field regions are defined at this point as the regions of the wafer which are not covered by the regions of photoresist 11. The regions of photoresist 11 are formed using a standard lithography process in which a thin layer of resist is spun over the entire surface of the wafer and then selectively exposed through a mask pattern or by a directly scanned electron beam. This is followed by a developing step which removes areas of the photoresist which have been exposed to the light or to the electrons. This is known as a positive lithography process using a positive resist material. After the layer of resist has been exposed and developed a thin layer of thermal oxide 12 is typically grown over the exposed surfaces of the semiconductor wafer so that the implant in the field regions will be made through the thin oxide layer.

A light implantation of ions of a P-type material such as boron is performed using an ion implantation apparatus. This field implant is done to provide greater electrical isolation between the active device regions which lie under the regions 11 of photoresist material.

After the implantation step shown in FIG. 1, wafer 10 is typically placed in a furnace and thick field oxide regions 15 are grown in a wet oxidation process. During this oxidation process, the implanted ions 14 are driven into the semiconductor substrate to underlie the field oxide regions 15.

After this step, the masking regions 11 are removed and a thin gate oxide 17 is formed in the active device regions 18. At this point, a second ion implantation step, using an N-type dopant material such as phosphorus, may be performed to tailor the threshold voltage of the silicon gate field effect transistor devices to be formed in the active regions. Accordingly, N-type dopant ions 16 will be implanted through the gate oxide layer 17 in a light implant step to create the implanted region 18.

After this light threshold setting implant has been performed, the silicon gate regions 19 of the field effect transistor devices are formed on the wafer using a lithography and etching step to produce the device topology shown in FIG. 3. Thereafter, a heavy implantation of N-type ions such as arsenic may be performed to simultaneously dope the silicon gate element 19 and the source and drain regions 21 and 22 to complete the basic structure of the silicon gate field effect transistor device.

Many additional fabrication steps are required to complete the integrated circuit processing, but the above steps are illustrative of some of the various ion implantation steps with different species that are performed in a relatively simple process. Other semiconductor processes, such as CMOS and bipolar processes, typically employ a substantial number of ion implantations steps that vary in species implanted, implant dosage, and implant energy.

Desirable Features of Ion Implantation Systems

To perform effectively in modern IC manufacturing facilities, ion implantation systems must be capable of efficiently performing most or all of the ion implantation steps required in increasingly complicated wafer processing recipes. High ion beam current levels are required for efficient performance of high dosage implants. Control of implanted beam energy is vital to controlling the profile of the implanted region in the wafer. To achieve such beam energy control over a sufficiently wide range of energies generally requires the use of a post acceleration system.

Aitken U.S. Pat. No. 4,578,589 discloses ion beam line technology that provides dramatically improved performance in an ion implantation system from a number of standpoints. A commercially available ion implantation system called the Precision Implant 9000 system (Applied Materials, Inc., Santa Clara, Calif.) incorporates this invention. These form the preferred environment for the system and method of this invention as applied to ion implantation systems for semiconductor processing and will be used to illustrate the application of the invention. The disclosure of the U.S. Pat. No. 4,578,589 is hereby incorporated by specific reference to fill in details of the overall beam line system which are not set forth herein.

It is particularly significant that the beam line technology of the U.S. Pat. No. 4,578,589 and the Precision Implant 9000 system provide improved beam current without a radical scale up of the size of beam line components. However, this improved beam current performance tends to exacerbate the problem that all high current ion implanters tend to have in maintaining reasonable and efficient ion beam size in the post acceleration region of the system under some conditions of beam current and overall acceleration voltage.

FIG. 4 is a schematic illustration of the beam line components in the Aitken U.S. Pat. No. 4,578,589 and FIG. 5 is a schematic diagram of a post-acceleration system of the general prior art type. Consideration of these diagrams will assist in understanding of the beam blow-up problems that are often encountered in the post-acceleration region of high current implanters.

The main components of the beam line 100 shown in FIG. 4 are an ion source assembly 130, an analyzing magnet assembly 140, a beam resolving slit assembly 150, a post-acceleration assembly 160, and a target assembly 170. For purposes of this illustration, ion source assembly 130 is considered to include the ion source itself and the extraction electrode arrangement used to extract an ion beam from the source at a beam energy corresponding to a pre-analysis acceleration voltage. These arrangements will be discussed in more detail below.

Ion source arrangement 130 produces an ion beam 131 and a beam analyzing means such as the electromagnet arrangement 141, 142 receives ion beam 131 and separates various ion species in the beam on the basis of mass (i.e. charge-to-mass ratio) to produce an analyzed beam 131' exiting the analyzing arrangement 140. The analyzed beam 131' in effect comprises a number of ion beams, but only the beam the desired chemical species passes through a resolving slit in the resolving arrangement 150. This results from controlling the magnetic field strength of the electromagnet so that the desired beam is directed through the resolving slit. At this point the ion beam energy and the velocity of the individual ions in the beam are due solely to the pre-analysis acceleration voltage used in the ion beam extraction system.

In the post-acceleration system 160, the ion beam is accelerated to a final desired energy by passing it through an electrostatic accelerating field produced by applying direct current voltages to a set of spaced electrodes as shown in FIGS. 5A and 5B. It should be understood that the term "accelerate" is used in a mathematical vector sense herein and thus has both magnitude and sign. In other words, the ion beam may be accelerated in a positive or negative sense. Positive acceleration increases ion beam energy and negative acceleration decreases ion beam energy.

In FIGS. 5A and 5B, a three electrode, two gap post-acceleration system is depicted in a schematic fashion. Each of the electrodes 161–163 (FIG. 5A) and 165–167 (FIG. 5B) is a conductive metal plate with a central aperture through which the ion beam passes. Voltages are typically applied to the electrodes through a voltage dividing network 164. Usually the voltage dividing network is associated with a set of spaced voltage grading rings that control the spatial distribution of graded voltages across the length of the accelerator tube. In FIG. 5A the direction of the electric field through the post-acceleration electrode arrangement 160A is such that a beam of positive ions is under the influence of a positive accelerating field and the energy and velocity of the ions in the beam will be increased. In FIG. 5B, the direction of the electric field through the post-acceleration electrode arrangement 160B is such that a beam of positive ions is under the influence of a negative accelerating field and the energy and velocity of the ions in the beam will be decreased.

One of the problems that is encountered in high current ion implantation systems is the tendency of the ion beam to blow-up in size in the post acceleration system under conditions of high current and/or low accelerating voltage. This is due to loss of space charge neutralization of the beam in passing through an electrostatic accelerating field in the post-acceleration region. If the ion beam has high perveance at any point in the post-acceleration region, beam blow-up can occur.

A space charge neutralized ion beam is one in which the positively charged ions in the beam are balanced by the negative charge on electrons within the beam. In such a beam, the electrostatic repelling forces between ions and electrons of like charge are compensated by the electrostatic attracting forces between the ions and electrons of opposite charge.

It is generally not difficult to generate an ion beam with good space charge neutralization in the region of a high current implanter between the source extraction system and the mass resolving slit. There are generally enough free thermal electrons in this region to provide space charge neutralization and to maintain good space charge neutralization of the ion beam in passing through the mass analysis system since there are not externally applied electrostatic forces on the beam. However, if the ion beam must be accelerated after passing through the beam analyzing and beam resolving systems, this destroys the space charge neutralization of the beam. The electrostatic accelerating field accelerates the electrons and positive ions in different directions so that space charge neutralization is lost and the ion beam has net positive charge. When the beam has such net positive charge, the repelling forces of the ions starts to predominate and the size of the ion beam becomes larger.

Ion beam perveance is directly proportional to beam current and to the square root of the mass of the ion, and inversely proportional to the 3/2 power of the beam voltage. Ion beams of low current or high voltage tend not to have a beam blow-up problem. Ion beams of high current and low voltage tend to have a large beam blow up problem, especially for higher mass ions such as phosphorus and arsenic. Thus in earlier high current machines, arsenic beam currents of 10–12 milliamps with 20–40 volts of post-acceleration tended to have a beam blow up problem. The Precision Implant 9000 system generates arsenic beam currents in excess of 30 milliamps and thus tends to have a substantial beam blow up problem in the post-acceleration region with small post-acceleration voltages.

Beam size blow up is disadvantageous from several standpoints. If the beam blows up to the point that a significant fraction of the beam strikes the post-acceleration electrode structure, this causes loss of effective beam current striking the target wafer and increases the current drain in the post-acceleration power supply without any resultant benefit. Another disadvantage is that the ion beam size may be larger than is desirable at the target wafer so that a large portion of the beam is wasted.

One of the approaches taken in the prior art to remediating this beam blow up problem is to limit the length of the post-acceleration region that the accelerating voltage is applied across and to make that region as close to the target element as is possible. Thus, shorting bars such as the bar 186 in FIG. 6 are often used in the prior art to apply a low post-acceleration voltage across only the last one or two electrode gaps. This reduces the distance over which the ion beam travels during acceleration and lessens the amount of the beam size enlargement that occurs prior to the beam striking the target element. This approach is insufficient to solve the problem of beam enlargement in an ion beam that has very high perveance and is thus subject to rapid blow up in size.

A straightforward and obvious approach to solving the beam blow up problem would be to add a focussing lens arrangement at the end of the post-acceleration electrode arrangement. Thus, as shown in FIG. 6, an einzel lens arrangement 180 could be simply added at the end of the post-acceleration electrode arrangement 185. The einzel lens includes its own separate electrode structures and must be placed downstream of the post-acceleration electrodes to provide convergent focussing for the now diverging ion beam due to loss of space charge neutralization in the post-acceleration region. As is also well known, the strength of the enzel lens is dependent on its overall length and the magnitude of the applied voltage. When the einzel lens action is not required, the voltage thereon could be turned off. The einzel lens does not affect the post-acceleration of the ion beam since the net electric field from one end of the lens to the other is zero. Ions in the beam are accelerated in one part of the lens region and decelerated in the other part. This provides the focussing action of the lens.

One disadvantage of the arrangement shown in FIG. 6 is that a substantial volume of space is occupied by the separate einzel lens structure and this increases the overall size of the post-acceleration region of the system. In addition, although the einzel lens is not needed under all conditions of beam current and post-acceleration voltage, its presence lengthens the distance between the last acceleration electrode and the target element. This tends to exacerbate beam blow up and thus tends to require that the lens be actually deployed under post-acceleration operating conditions where it would not be required but for the additional distance of beam travel due to the presence of the lens.

Another disadvantage is that the increased number of electrodes in the post-acceleration region increases the length over which aceleration and focusing is performed and the aperture sizes in the electrodes must be increased in the downstream direction in order to ensure clean beam transmission during post-acceleration voltage transients. These larger aperture sizes lead to weaker focusing in the downstream region of the post-acceleration system.

SUMMARY OF THE INVENTION

Objects

It is principal object of this invention to provide an improved system and method for post-accelerating a beam of ions.

It is another object of this invention to provide an improved system and method of post-accelerating a beam of ions in plural modes of operation depending on ion beam conditions.

It is a specific object of this invention to provide an improved system and method for post-acceleration of an ion beam in a high current ion implanter system.

It is another object of this invention to provide a post-acceleration system which uses a common set of electrodes to provide multiple modes of operation under different ion beam current and voltage conditions.

FEATURES AND ADVANTAGES

General System Features

One aspect of this invention features a system for post-accelerating a beam of ions between an beam input voltage and a beam destination voltage. The system includes an electrode system having a first electrode at the beam input voltage, a last electrode at the beam destination voltage, and a set of intermediate electrodes therebetween. [The term "set" is used in the mathematical sense herein, but is restricted not to include the null set, i.e. one with no members. Thus "a set of intermediate electrodes" means at least one intermediate electrode.]

An arrangement is provided for establishing a first beam acceleration mode, and it includes a first arrangement for applying a first set of voltages to the set of intermediate electrodes to create a working beam acceleration region having a substantially linear voltage gradient. Another arrangement establishes a second beam acceleration mode and it includes a second arrangement for applying a second set of voltages to the set of intermediate electrodes to create a working beam acceleration region having a substantially non-linear voltage gradient to increase the beam focusing power within the working beam acceleration region.

From this it can be seen that, in general, this invention provides the advantage of being able to select between post acceleration through a linear voltage gradient under ion beam conditions where high beam perveance will not be present and through a non-linear voltage gradient when high beam perveance will be present. The same electrode structure is used in both modes of operation so the system has full flexibility of usage in each mode.

In the most useful case, the ion beam comprises a beam of positive ions which have been pre-accelerated to a preselected initial energy and are accelerated to a final energy at the last electrode. In the broadest application of the invention, the set of intermediate electrodes comprises a single electrode. In general, the non-linear voltage gradient could be arranged so that the beam is first subjected to negative acceleration and then is subjected to positive acceleration to have the finally desired beam energy. However, since beam perveance increases as the energy of the beam decreases, this could exacerbate the beam blow-up problem under some conditions. For this reason, in this broadest case, the second set of voltages comprises a single voltage having a value more negative than both the beam input voltage and the beam destination voltage so than the positive ion beam is first positively accelerated between the first electrode and the intermediate electrode to an energy greater than the final energy and then negatively accelerated between the intermediate electrode and the last electrode to the final energy.

Application of the Invention to Both Positive and Negative Acceleration

This invention may be applied in cases where it is desired to subject a positive ion beam to either positive acceleration or negative acceleration. In the first case, the beam input voltage is positive relative to the beam destination voltage so that the positive ion beam undergoes overall positive acceleration therebetween to a final energy higher than the initial energy, and the second set of voltages each comprises a voltage having a value more negative than the beam destination voltage so that the positive ion beam is first positively accelerated to an energy greater than the final energy and then negatively accelerated to the final energy.

In the second case involving negative acceleration of the ion beam, the beam input voltage is negative relative to the beam destination voltage so that the positive ion beam undergoes negative acceleration therebetween to a final energy less than the initial energy, and the second set of voltages each comprises a voltage having a value more negative than the beam input voltage so that the positive ion beam is first positively accelerated to an energy greater than the initial energy and then negatively accelerated to the final energy.

General Method Features

This invention also features a method for post-accelerating a beam of ions between a beam input voltage and a beam destination voltage with plural mode focusing of the beam. The general steps of the method are:

selecting one of first and second modes of operation;
forming in the first mode of operation a beam accelerating field between the beam input voltage and the beam destination voltage having a substantially linear voltage gradient; and forming in the second mode of operation a beam accelerating field between the beam input voltage and the beam destination voltage having a substantially non-linear voltage gradient.

This invention may also be considered to feature a method for post-accelerating a beam of ions between a beam input voltage and a beam destination voltage with plural modes of focusing of the beam and which includes the steps of:

disposing in the path of the beam a first electrode, a last electrode and a set of intermediate electrodes to define a working beam acceleration region between the first and last electrodes;

applying the beam input voltage to the first electrode;
applying the beam destination voltage to the last electrode;

applying a first set of voltages to the set of intermediate electrodes during a first of the modes to create a substantially linear voltage gradient in the working beam acceleration region; and applying a second set of voltages to the intermediate electrodes during a second of the modes to create a substantially non-linear voltage gradient in the working beam acceleration region.

The method of the invention shares the same advantages of the system of the invention as discussed above and these need not be repeated here. It also can employ a variety of modes of operation for both positive acceleration and negative acceleration of the ion beam.

Features and Advantages of a Specific Embodiment

A currently preferred embodiment of this invention features an ion beam post-acceleration system with an electrode system that includes a terminal electrode, a destination electrode, and a set of intermediate electrodes defining a working beam acceleration region between said terminal and destination electrodes. A first power supply arrangement supplies a beam input voltage to the terminal electrode and a reference voltage to the destination electrode. A voltage gradient tube is disposed over the electrode system and is formed of electrically insulating material with a substantial number of spaced voltage gradient rings disposed thereon.

A voltage dividing resistor chain is connected on one end to the terminal electrode and on the other end to the destination electrode and at intermediate points to the voltage gradient rings. A set of electrical connections is provided for connecting each electrode in the set of intermediate electrodes to one of the voltage gradient rings.

The system has two operating modes. A terminal shorting bar arrangement is selectably actuatable during a first operating mode of the post acceleration system for shorting together the terminal electrode and a selectable set of the voltage gradient rings to select an active set of the electrodes to be deployed in accelerating the beam and to provide a substantially linear voltage gradient thereacross. This is the standard mode of operation of the post-acceleration system.

A reconfiguration system is selectably actuatable during a second operating mode of the post acceleration system to convert the electrodes into a combined beam acceleration and converging lens system. This reconfiguration system includes a second power supply arrangement for supplying a direct current lens voltage having a magnitude substantially different from both of the reference voltage and the beam input voltage. It also features a voltage application system including at least a first voltage application arrangement for applying the lens voltage to at least one of the voltage gradient rings to provide a substantially non-linear voltage gradient across the electrode system.

It is thus seen that the system of this invention provides the advantage of being able to easily and conveniently convert a standard post-acceleration system to one in which the intermediate electrodes which are not required for the post-acceleration function are employed to provide extra lens action to converge the ion beam to a smaller size. By converting a portion of the post-acceleration electrodes to operate as converging lens, the smaller aperture size of these electrodes, especially the upstream ones, provides a strong lens as will be evident from the more detailed discussion given below, the system of this invention can be adapted to both positive acceleration and negative acceleration and it can be adapted for use in a wide variety of systems with different numbers of intermediate electrodes in the set of intermediate electrodes.

In a preferred embodiment, the system employs a set of intermediate electrodes comprising at least two electrodes. The voltage application system includes a second voltage application arrangement for applying the reference voltage to one of the voltage gradient rings upstream of the first voltage application arrangement for defining a beam acceleration region followed by a beam focusing region. Preferably an arrangement is provided for varying the positions of the first and second voltage application devices and thereby varying the respective lengths of the beam acceleration region and the beam focusing region. This enables the system to conveniently handle varying requirements of magnitude of post-acceleration voltage by varying the number of intermediate electrodes involved in the post-acceleration action and the number that are involved in the separate lens for beam focussing.

Thus it can be seen that the invention contemplates one form in which the post acceleration action and converging lens action are integrated and another form in which the post acceleration action and the converging lens action are provided by separate sets of electrodes. In any case the same set of electrodes is employed as between the two different modes of operation of the post-acceleration system.

The system of this invention can be implemented in a number of specific different embodiments involving flexibility in configuring the number of electrodes involved in each function. It can also be implemented both for positive and negative acceleration of an ion beam. This invention thus provides the advantage of a simple approach to enabling a post-acceleration system to deal with a wide variety of the ion beam conditions in a high current implanter. Only a simple change of voltages applied to the voltage gradient rings on the outside of the post-acceleration tube is required to convert to a mode of operation for low post-acceleration voltages which provides sufficiently powerful focussing action on the beam to counteract space charge blow up of the beam in the region where post-acceleration has been performed.

Other objects, features and advantages of this invention will be apparent from a consideration of the detailed description given below in conjunction with the accompanying drawings.

BRIEF DESCRIPTION OF THE DRAWINGS

FIGS. 5A and 5B are schematic diagrams useful in explaining the general concepts of post-acceleration of ion beams.

FIG. 6 is a diagram of a post-acceleration system which combines a standard post-acceleration electrode section with a standard einzel lens arrangement and form a portion of the background of this invention.

FIGS. 7A–7C are schematic illustrations of the application of the system and method of this invention in a three electrode post-acceleration system.

FIG. 8 is a graph illustrating the various voltage gradients related to the electrode systems shown in FIGS. 7A–7C.

FIGS. 9A–9C are schematic illustrations of the application of the system and method of this invention in a four electrode post-acceleration system.

FIG. 10 is a graph illustrating the various voltage gradients related to the electrode systems shown in FIGS. 9A–9C.

FIGS. 11A–11C are schematic illustrations of the application of the system and method of this invention in a six electrode post-acceleration system.

FIG. 12 is a graph illustrating the various voltage gradients related to the electrode systems shown in FIGS. 11A–11C.

EXAMPLES OF GENERAL PRINCIPLES OF THE INVENTION

Figure 1:
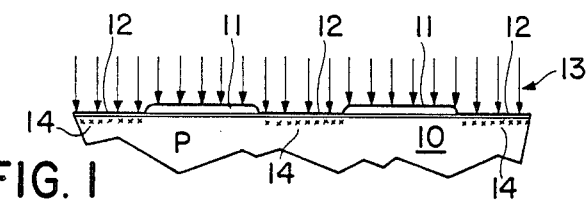
FIGS. 1–3 are schematic diagrams of wafer processing steps which are useful in explaining the background of this invention.
Figure 2:
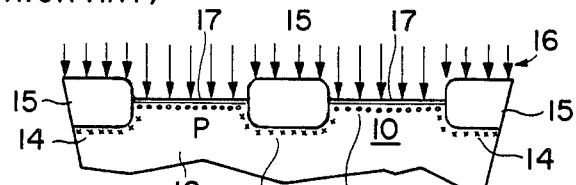
Figure 3:
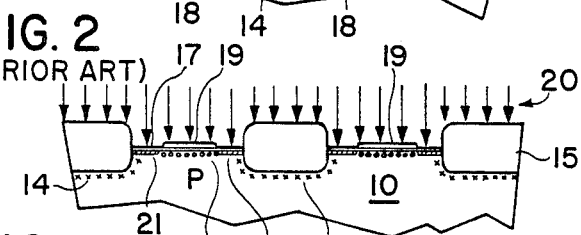
Figure 4:
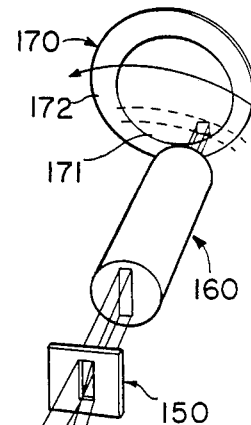
FIG. 4 is a schematic diagram of an ion implanter beam line arrangement in which the system of this invention may be employed.

FIGS. 7–12 illustrate the general principles of this invention with examples of three, four and six electrode ion beam post-acceleration systems, respectively. In the three electrode case of FIGS. 7A–7C, the maximum working region involves two electrode gaps. In FIGS. 7A the actual working beam acceleration region ("working region") involves both gaps between the three electrodes E1-E3 and, as shown by the curve A in FIG. 8, the voltage gradient between E1 and E3 is linear. The bracket around the V/2 designation of the voltage on the electrode E2 indicates that that voltage is fixed by the resistor divider chain and not by actual application of that separate voltage to that electrode. The examples given and discussed here assume a positive ion beam, but It should be understood that the principles of the invention could also be applied to a beam of negative ions. In most applications, positive ions will be used since negative ions are difficult to produce compared to positive ions.

In FIG. 7B the working region is between the second and third electrodes since the second electrode is fixed at the same voltage as the first. Again as shown by the curve B in FIG. 8, the voltage gradient in the working region is linear. In contrast, in FIG. 7C, the working region is between the first and the third electrodes, but the application of a −VL potential to the second electrode causes the working region to have a non-linear voltage gradient. This is shown graphically by the curve C in FIG. 8. The result of this non-linear voltage gradient is to create a stronger converging lens in the working region. Note that each of the biasing arrangements shown in these Figures results in the same ion beam post-acceleration.

If the ion beam has low perveance due to current and voltage characteristics, then one of the electrode biasing schemes shown in FIGS. 7A and 7B may be used and the choice may be made on the basis of the magnitude of V relative to the maximum voltage that can be used across a single gap in the system. The considerations that determine this are discussed below. On the other hand, if the ion beam has high perveance, then the second biasing mode shown in FIG. 7C may be selected to increase the converging power of the post-acceleration system.

It should be understood that the electrode biasing example given in FIG. 7C is only one specific case of the general principle of this invention of providing a second mode of operation of the same electrode structure by converting from one biasing arrangement to another. In this arrangement the ion beam is first subjected to a positive acceleration between E1 and E2, and then is subjected to a negative acceleration between E2 and E3. For another example, a +VL potential could be applied to the second electrode. This would result in the ion beam being subjected to negative acceleration between the first and second electrodes and then positive acceleration to final ion beam energy between the second and third electrodes.

In most cases where it is important to provide the extra focussing power that use of this invention facilitates, the use of a converging lens arrangement involving negative acceleration followed by positive acceleration is not preferred. Reducing the energy of the beam tends to increase beam perveance while also increasing the effectiveness of the lens action. However, it is expected that the increase in beam perveance will tend to overcome the improvement in focusing power. It will be more advantageous to use the combination of positive acceleration followed by negative acceleration since this combines lowering of beam perveance in the process of performing positive acceleration thereon with converging lens action.

The degree of converging power of the lens formed by the non-linear voltage gradient is determined by the degree of non-linearity which is controlled by the magnitude of the difference between the acceleration voltage $+V$ and the lens voltage, which is $-VL$ in the case of FIG. 7C. It should be understood that the reference voltage could be other than actual earth ground and that the invention applies equally to negative acceleration and positive acceleration of the ion beam. For example, assuming a positive ion beam, a negative acceleration would result if the voltages on the first two electrodes in FIG. 7C were reversed. This would generally not be a desirable biasing arrangement, however, because the negative acceleration of the positive ion beam would be accompanied by positive acceleration of electrons. This would tend to sweep electrons out of the region upstream from the post-acceleration system and could destroy the space charge neutralization of the ion beam in that region where it is important to maintain constant beam size. Moreover, beam perveance would be increased by negative acceleration of the ion beam in the first electrode gap.

For overall negative acceleration of a positive ion beam, it is necessary for the voltage on the beam input electrode to have a negative value and it is preferable for the voltage on the intermediate electrode to have a higher negative value. This provides positive acceleration of the beam followed by negative acceleration, avoiding an increase in beam perveance and preventing electrons from being removed from upstream regions of the beam.

FIGS. 9 and 10 illustrate the principles of this invention as applied to a four electrode system, E1-E4. FIG. 9A and curve A in FIG. 10 illustrate one mode of operation with a linear voltage gradient and FIGS. 9B and 9C together with associated curves B and C in FIG. 10 illustrate the converted mode of operation with a non-linear voltage gradient. In FIG. 9B the non-linear voltage gradient is arranged by applying a single voltage to the third electrode E3 and letting the resistor divider chain determine the voltage on the second electrode E2. In FIG. 9C the second through fourth electrodes are configured as an einzel lens by applying reference potential to both the second and fourth electrodes E2 and E4 and the lens voltage to the third electrode E3.

An einzel lens is one in which the first and last lens electrodes are connected to reference voltage and the same voltage magnitude is placed on all electrodes intermediate the first and last lens electrodes. As has already been shown, this invention is not limited to use of einzel lens arrangements in the second or converted mode of operation of the post-acceleration system. However, the einzel lens turns out to be a convenient form of converging lens to use in practice when applying the invention to an actual ion implantation system. The placement of ground reference potential on an electrode upstream from those to which the negative lens voltage is applied is also preferable for the practicable reason of separating the positive and negative power supplies so that they don't look at each other. This precludes the two different polarity supplies from being shorted together by a spark between adjacent electrodes.

FIGS. 11 and 12 illustrate the application of this invention to a six electrode, five gap system, E1-36, which is the one that is implemented in the current commercial system referred to above as the Precision Implant 9000 system. In a first operating mode of the post-acceleration system of FIG. 11, a terminal shorting bar 190 shorts together the terminal electrode E1 and a selectable set of intermediate electrodes by shorting the terminal to the external stress rings connected to those intermediate electrodes.

In the example given in FIG. 11A, the first three intermediate electrodes E2-E4 are shorted to the terminal electrode so the post-acceleration voltage is applied across only the last two gaps of the post-acceleration system. In effect electrode E4 becomes the first electrode and E6 becomes the last electrode and the working region for ion beam acceleration extends therebetween. As shown in FIG. 12, curve A, there is a linear voltage gradient in the working region.

FIG. 11B illustrates a second mode of operation in which a lens voltage $-VL$ is provided by a separate power supply and a first voltage application arrangement 191 applies the lens voltage to the stress rings associated with electrodes E4 and E5. A second voltage application arrangement 192 applies the reference voltage (ground in this case) to electrode E3. This turns region between the electrodes E3 and E6 into an einzel lens. The two voltage application arrangements define a beam acceleration region and a beam focusing region wherein the overall working region of the post-acceleration system. While the voltage in the beam acceleration region is linear, the overall voltage gradient in the working region is non-linear. This is shown by the curve B in FIG. 12.

It should be understood that it is not essential to provide the second voltage application arrangement to form an einzel lens. The lens voltage could be applied to one of the stress rings associated with E4 or E5 and let the resistor divider chain determine the voltage distribution on the other electrodes.

FIG. 11C illustrates that it is preferable to provide for altering the position of the second voltage application arrangement 192 to control the relative lengths of the acceleration region and the focusing region. In FIG. 11C, the second voltage application arrangement 192 applies the reference voltage to electrode E2 so the acceleration region of curve C, FIG. 12, is a single electrode gap. Correspondingly, the focusing region occupied by the einzel lens structure covers four electrode gaps from E2 to E6. This longer einzel lens provides for stronger focusing power and thus more converging lens action on the ion beam.

The arrangement of FIG. 11C would typically be used for cases of small post-acceleration, for example in the range of up to about 30 kV. For post-acceleration in this range with high ion beam currents, the perveance of the beam is typically quite high. Thus it is a benefit to be able to have a longer, stronger einzel lens under these conditions. This benefit illustrates that the conversion mode aspect of this invention makes it possible to take maximum advantage of the electrodes that are not being used for the actual post-acceleration function. The post-acceleration region and the converging lens or focusing region work hand in hand so that the benefits of the converging lens is strongest, i.e. the lens action is strongest when it is most needed under conditions of low post-acceleration voltage.

It should be apparent that this invention can be applied to a post-acceleration system having any number of intermediate electrodes. For post-acceleration voltages as high as 160 kV, it is preferable to have at least five electrode gaps to distribute the post-acceleration voltage across when the maximum post-acceleration of the beam is desired. Providing a large number of gaps reduces the voltage drop between gaps and correspondingly decreases the probabilities of a spark occurring between two adjacent electrodes during operation of the system. This means that the post-acceleration runs quieter during implantation to improve the quality of the implant being performed. It also tends to result in a shorter conditioning period when the post-acceleration system is first pumped down and turned on. All of these are substantial benefits for the overall ion implantation system.

Specific Examples of Post-Acceleration System Operation

To illustrate the principles of this invention more completely, it will be helpful to give some specific examples. Assume that the five gap system shown in FIG. 11 is being used and for quiet operation it is preferable to maintain the maximum voltage drop between gaps to 32 kV. This is the preferred operation of the Precision Implant 9000 machine. Consider the case where sixty four kilovolts of post-acceleration are required. If the ion beam current is low so that ion beam perveance is not expected to be a problem, the set up shown in FIG. 11A could be used with the post-acceleration voltage +V equal to 64 kV and the overall voltage distribution on the post-acceleration electrodes being as follows:

| E1 | E2 | E3 | E4 | E5 | E6 |
|----|----|----|----|----|----|
| 64 | 64 | 64 | 64 | 32 | 0  |

For any post-acceleration voltage between 32 and 64 kV, this arrangement would be suitable and the value of +V would be adjusted by adjusting the output of the post-acceleration power supply.

On the other hand, if the ion beam current is high, e.g. 30 milliamperes of arsenic, then the ion beam perveance would be quite high in the post-acceleration region and the mode of set up shown in FIG. 11B would be much preferable. Under the same post-acceleration voltage conditions, the voltage distribution would be the following:

| E1 | E2 | E3 | E4  | E5  | E6 |
|----|----|----|-----|-----|----|
| 64 | 32 | 0  | -32 | -32 | 0  |

For 32 kV post-acceleration of the ion beam, one of the following distributions of voltage could be selected based on the degree of beam perveance anticipated.

Low Pereance Beam at 32 kV post-acceleration:

| E1 | E2 | E3 | E4 | E5 | E6 |
|----|----|----|----|----|----|
| 32 | 32 | 32 | 32 | 32 | 0  |

High Pereance Beam at 32 kV Post-acceleration:
Alternative One:

| E1 | E2 | E3  | E4  | E5  | E6 |
|----|----|-----|-----|-----|----|
| 32 | 0  | -32 | -32 | -32 | 0  |

Alternative Two:

| E1 | E2 | E3  | E4  | E5  | E6 |
|----|----|-----|-----|-----|----|
| 32 | 0  | -32 | -64 | -32 | 0  |

Small Post-acceleration Voltage:
Alternative One:

| E1 | E2  | E3  | E4  | E5  | E6 |
|----|-----|-----|-----|-----|----|
| 2  | -30 | -32 | -32 | -32 | 0  |

Alternative Two:

| E1 | E2  | E3  | E4  | E5  | E6 |
|----|-----|-----|-----|-----|----|
| 2  | -30 | -62 | -64 | -32 | 0  |

Examples of Negative Acceleration:

Assume a condition of 20 kV of pre-acceleration of the ion beam, and a desired final beam energy of 4 kV, the post-acceleration voltage drop must be −16 kV. This can be achieved by application of the following voltages to the electrodes:

| E1  | E2  | E3  | E4  | E5  | E6 |
| --- | --- | --- | --- | --- | --- |
| −16 | −32 | −32 | −32 | −32 | 0  |

In this case the converging lens region and the acceleration region within the working region of the post-acceleration system is reversed and the lens action occurs first in an accelerating/decelerating lens, followed by negative acceleration of the ion beam. This can be seen more clearly from the following example of voltages applied:

| E1  | E2  | E3  | E4  | E5  | E6 |
| --- | --- | --- | --- | --- | --- |
| −16 | −32 | −32 | −32 | −16 | 0  |

In this case there is no change in beam energy between E1 and E5 and all the negative acceleration is produced between E5 and E6.

An alternative example providing stronger converging lens action would be the following:

| E1  | E2  | E3  | E4  | E5  | E6 |
| --- | --- | --- | --- | --- | --- |
| −16 | −48 | −80 | −64 | −32 | 0  |

There are a number of approaches that could be taken to implementing an actual system which embodies the general principles of this invention. A specific working example in the form currently implemented in the Precision Implant 9000 system will be described below.

SPECIFIC SYSTEM EMBODIMENT

Figure 13:
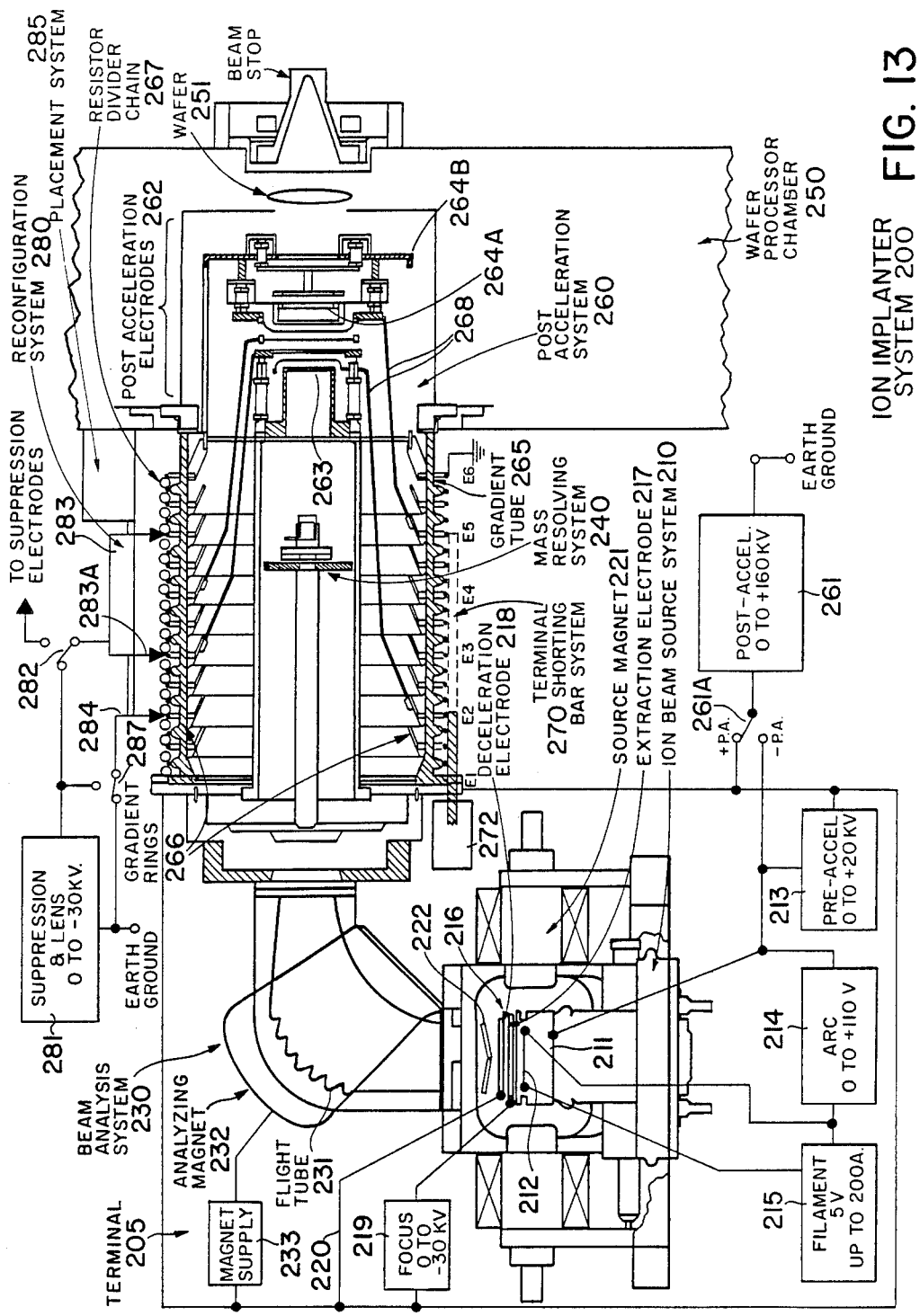
FIG. 13 is a schematic diagram showing one embodiment for implementation of the system and method of this invention in an ion implantation system.

FIG. 13 illustrates in mostly schematic diagram format an ion implanter system 200 in which this invention is implemented in a specific embodiment. Implanter system 200 includes a terminal 205 with an ion beam source system 210 mounted within the terminal. This source system is biased relative to the terminal to a selectable pre-analysis accelerating voltage by pre-accel supply 213 and thus produces an ion beam having energy corresponding to that acceleration voltage. The current of the ion beam is selectable by controlling the application of arc voltge from arc supply 214 to arc chamber 211 and and filament current from filament supply 215 to filament 212, along with control of the focus voltage applied to the extraction electrode 217 by the focus supply 219.

The particular ion beam source system 210 is a Freeman-type ion source, but it should be understood that this invention is not limited to the use of any particular type of ion source system. The operation of the Freeman ion source is well known and need not be described in detail here. Details of the structure and function of such a source and the extraction electrode system are given in the Aitken '589 patent. This type of ion source includes a source magnet arrangement 221 and and the ion beam is extracted by a an extraction electrode system 216 which includes extraction electrode 217 and deceleration electrode 218. The beam extraction voltage is determined by the difference in the positive voltage setting on the pre-accel supply 213 and the negative voltage setting on the focus supply 219. The maximum extraction voltage is thus 50 kV in the arrangement shown. The deceleration electrode is connected via direct electrical connection 220 to the terminal 205 which is the reference voltage for the entire ion source and extraction electrode shown. The ion beam is first extracted and accelerated between the ion source and the extraction electrode and then decelerated to final pre-analysis acceleration voltage between the extraction electrode and the deceleration electrode.

The beam of ions entering the beam analysis system 230 becomes space charge neutralized after passing through the deceleration electrode due to the presence of thermal electrons in that region. The ion beam enters the beam analysis system 230, passing through the flight tube 231 which is positioned between opposing poles of analyzing magnet system 232. The analyzing magnet system produces an analyzed ion beam in accordance with well known mass analysis principles and focuses the desired mass species in this analyzed ion beam through the resolving slit in mass resolving system 240 in a known manner.

Wafer processor chamber 250 includes an arrangement for positioning a target wafer 251 in the path of the resolved ion beam. The preferred version of wafer processor chamber 250 is the system disclosed in Robinson and Wauk U.S. patent application Ser. No. 774,192, filed Sept. 9, 1985, and entitled: "Systems and Methods for Ion Implantation of Semiconductor Wafers". The details of this copending and commonly assigned patent application are incorporated herein by reference to provide the details of a specific working embodiment of this invention.

A post acceleration system 260 is mounted between terminal 205 and target wafer 251 and operates to accelerate the resolved ion beam to a selectable final beam energy. The specific post-acceleration system of this invention has the capability of both accelerating the resolved ion beam to the final beam energy desired and maintaining adequate ion beam focus for all conditions of beam perveance encountered in the post-acceleration system.

Post-acceleration system 260 includes an electrode system 262 between the resolving system 240 and the target wafer 251 and a post-acceleration power supply 261 for supplying a selectable beam acceleration voltage to terminal 205 which is connected to the electrode system as described below. Voltage gradient tube 265 extends between terminal 205 and wafer processor chamber 250 and incorporates standard post-acceleration tube features. A substantial number of spaced voltage gradient rings 266 are disposed on voltage gradient tube 265 and this voltage gradient ring system includes both external stress rings and internal stress rings as shown. A voltage divider resistor chain 267 is connected on one end to terminal electrode 263 which extends back to the wall of the terminal 205 and is connected on the other end ground reference potential. This same ground reference potential is connected to the destination electrode 264 in the electrode system 262. At intermediate points the resistor chain is connected to voltage gradient rings to set the voltage gradient between the rings.

Between terminal electrode 263 and destination electrode 264 is a set of intermediate electrodes and a set of electrical connections connects each of these intermediate electrodes to one of the voltage gradient rings. In this embodiment, there are four intermediate electrodes, but this invention may be implemented in systems which include any number of intermediate electrodes in the set thereof, including a set of one intermediate electrode or a set larger than four intermediate electrodes.

In the system shown, destination electrode 264 has two separate electrode structures 264A and 264B which are connected together and a suppression magnet arrangement (not shown) is incorporated in the electrode structure 264A to prevent any electrons produced by the ion beam striking the destination electrode from escaping the region of the grounded destination electrode. This prevents such electrons from striking other electrodes in the post-acceleration system and adding unnecessarily to the post-acceleration current drain. The specific electrode system shown also includes a suppression electrode arrangement between the destination electrode structures 264A and 264B. Under certain operating conditions this suppression electrode arrangement will be biased to a negative voltage to suppress the flow of electrons generated on or in the vicinity of the target wafer from backstreaming into the post-acceleration system and unnecessarily adding to the post-acceleration current drain.

In accordance with this invention, a terminal shorting bar system 27 and a reconfiguration system 280 are provided in the post-acceleration system 260 to provide for three separate modes of operation which will be discussed below. Terminal shorting bar system 270 includes a shorting bar 271 and a position control arrangement 272 which controls how far the shorting bar is extended to short together the voltage gradient rings 266.

Reconfiguration system 280 includes a lens power supply 281 which doubles as a suppression power supply in one operating mode of the post-acceleration system as described below. Mode switch 282 controls application of the lens voltage to a first voltage application arrangement 283. Ground reference potential is connected directly to a second voltage application arrangement 284. In the specific example shown in this schematic representation, the first voltage application arrangement 283 applies the lens voltage to two voltage gradient rings associated with electrodes E3 and E5 and the second voltage application arrangement connects the ground reference potential to the voltage gradient ring associated with electrode E2. This corresponds to the arrangement shown in FIG. 11C. A placement system 285 controls the positioning of the two voltage application arrangements between an active position as shown and a parked position in which the reconfiguration system is inactive and the two voltage application arrangements are disconnected from the voltage gradient rings. This will be described in more detail below. Preferably, the placement system also removes the voltage application means from the air gap region between the terminal and the wafer processor chamber so there is no metallic elements interposed in the air gap when large post-acceleration voltages of up to 160 kV are applied across this region.

Operating Modes of System

Before considering the basic details of structure and operation of one embodiment of a reconfiguration system 280 as shown in other drawing figures, the schematic of FIG. 13 can be considered to illustrate the three operating modes of the system with the understanding that the first two operating modes to be described are the principal ones that provide the advantages of the invention and the third is a special case.

First Operating Mode—Linear Acceleration

In the first operating mode, the post-acceleration system is operated as a standard linear accelerator of the ion beam. The placement system 285 of the reconfiguration system 280 is operated to position the two voltage application means 283 and 284 in a remote parked position. The switch 282 is operated to apply the suppression voltage to the suppression electrodes. The resistor divider chain 267 together with the terminal shorting bar system controls the distribution of voltages to the intermediate electrodes. The terminal shorting bar system may position the terminal shorting bar in any one of five distinct positions for shorting, the first of which is a parked position with none of the electrodes shorted together and the last of which is a position of maximum extension in which the terminal electrode is shorted to all of the intermediate electrodes (shown in dashed lines in FIG. 13. The other positions involve shorting together of other sets of the intermediate electrodes and the terminal electrode. Thus, the terminal shorting bar operation in the first mode determines how may active post-acceleration gaps will be present but the resistor divider chain will provide a linear voltage gradient across the active-post acceleration electrode gaps.

The magnitude of the post-acceleration voltage will be controlled by the setting of the post-acceleration power supply 261. Between maximum post-acceleration of 160 kV and a post-acceleration of 128 kV, all five electrode gaps will be used with the terminal shorting bar withdrawn to the parked position. This keeps the maximum potential difference between electrode gaps at thirty two kilovolts which is the design maximum for this particular system arrived at from considerations of quiet post-acceleration system operation and reduced post-acceleration system conditioning on start-up. For post-acceleration between 128 kV and 96 kV, the terminal shorting bar would be placed in the position shown in FIG. 13 with the first intermediate electrode shorted to the terminal electrode so that four active electrode gaps would be employed. The chart below gives the position of the terminal shorting bar for various ranges of magnitudes of post-acceleration voltage applied.

| Post-acceleration Voltage Range (kV) | Electrodes Shorted by Terminal shorting bar |
| --- | --- |
| 0–32 | E1–E5 |
| 33–64 | E1–E4 |
| 65–96 | E1–E3 |
| 97–128 | E1–E2 |
| 129–160 | None |

It should be understood that this discussion is of one specific example and the invention is not limited to any particular number of intermediate electrodes or to any particular maximum voltage gradient across the gap between the electrodes in the post-acceleration system. It should also be understood that the above chart is not intended to mean that it is always necessary for the terminal shorting bar to short electrodes E1–E5 together for post-acceleration voltages in the range of 0–32 kV. That arrangement gives the highest focusing power in the post-acceleration system, but in some cases it may be desired to lower the focusing power and have the post-acceleration voltage applied across two or more gaps.

Second Operating Mode—Acceleration With Extra Focusing

In the second operating mode, the terminal shorting bar system is inactive and the reconfiguration system 280 is placed in an active position. The switch 282 applies the lens voltage to the first voltage application means 283. For purposes of this discussion, it will be understood that the reconfiguration system 280 has the feature of being able to alter the position of the second voltage application means 284 to apply the ground reference potential to the voltage gradient ring connected to electrode E3 and at the same time to alter the position of the element 283A of the first voltage application means to apply the lens voltage to the electrode E4 to create the biasing arrangement shown in FIG. 11B.

In this specific embodiment the reconfiguration system may be used for post-acceleration voltages up to 64 kV. For post-accleration voltages in the range of 0–32 kV, the specific arrangement shown in FIG. 13 and diagramed in FIG. 11C provides for up to 32 kV post-acceleration across a single electrode gap between electrodes E1 and E2 followed by converging einzel lens action between electrodes E2 and E6. For post-acceleration voltages in the range of 33–64 kV, the alternative positioning arrangement discussed above and depicted in FIG. 11B provide for post-acceleration across two electrode gaps and a shorter, less powerful einzel lens action.

The power of the einzel lens arrangement can be controlled in each case by altering the magnitude of the lens voltage applied thereto. In practice, the post-acceleration system can be calibrated to determine an effective mode of operation and effective post-acceleration parameter values for different implant conditions. In particular, for each ion species, the system can be calibrated to determine at what level of ion beam current the mode of operation for post-acceleration voltage below 64 kV should be shifted from the linear voltage gradient mode to the non-linear voltage gradient mode. Then, within the 32–64 kV range of post-acceleration, the ion beam current levels can be matched with appropriate levels of lens voltage for the einzel lens arrangement to obtain the desired ion beam size. The same type of calibration can be done relative to the 0–32 kV range of post-acceleration. These calibration values can be stored in computer memory and recalled for automatic computer set up of the post-acceleration system both in terms of mode and operating parameters within each mode.

Third Operating Mode—Zero Post-acceleration With Einzel Lens

Under some operating conditions it is desirable to have zero post-acceleration of the ion beam and to have the einzel lens arrangement available for focusing the ion beam to a desired size. Because space charge neutralization of the ion beam downstream of the resolving slit cannot be assured even under conditions of zero post-acceleration, a high current beam at low pre-analysis acceleration voltage setting may have substantial space charge blow up in the post-acceleration region. Thus the third operating mode of this invention provides for einzel lens action with zero post-acceleration.

The third operating mode involves active use of both the terminal shorting bar system 270 and the reconfiguration system 280, with both in the active positions depicted in FIG. 13. The post-acceleration power supply 261 is set to zero post-acceleration voltage, but to make sure that the terminal does not float up to some other voltage, the terminal shorting bar is positioned to short the terminal electrode to electrode E2. The configuration system 280 is placed as shown in FIG. 13 so that the ground voltage is placed on electrode E2 by the second voltage application means 284. This earth ground reference is thus applied to the terminal through the terminal shorting bar. The einzel lens action is present due to lens voltage applied through the first voltage application means 283 to the electrodes E3 through E5. The strength of the converging lens action is determined by the magnitude of the lens voltage.

Negative Acceleration Mode

All of the descriptions above relate to positive acceleration of a positive ion beam which is the more typical operation of a post-acceleration system. With the ion beam line arrangement of the Aitken U.S. Pat. No. 4,578,589, it is possible to obtain relatively large beam currents at low pre-accel voltages because of the accel-decel arrangement of the ion extraction system which is described in detail in the U.S. Pat. No. 4,578,589. However, for maximum ion beam extraction, it is preferable to run at full pre-accel voltage of +20 kV and tune the focus voltage for maximum extraction of the ion beam. The system of this invention makes it possible to do effective post-acceleration in the sense of negative acceleration of the beam to reduce the final beam acceleration to less than +20 kV.

For positive post-acceleration, the switch 261A is placed in the position shown in FIG. 13 so that the post-acceleration voltage is directly applied to the terminal. For negative post-acceleration the switch 261A is placed in the other position, and the post-acceleration voltage is adjusted to be in the range from about +2 to about +20 kV. The application of the post-acceleration voltage to the other side of the pre-accel supply causes the terminal potential to become negative at a value equal to the difference between the pre-accel voltage and the setting of the post-acceleration supply. Thus a +2 kV setting of the post-acceleration supply and a +20 kV setting of the pre-accel supply produces a −18 kV potential on the terminal. This arrangement will produce 20 kV of preacceleration (between +2 on the source and −18 on the decel electrode followed by −18 kV of negative acceleration between the terminal electrode and ground reference in the post-acceleration system.

This is preferable to setting the pre-accel supply to +2 kv and having the post-acceleration supply at zero because it provides for a lower perveance of the ion beam in the extraction region and thus less beam blow up in that region where the beam has not yet become space charge neutralized. Einzel lens action under negative post-acceleration can be obtained by switching the position of switch 287 to apply the negative lens voltage to the second voltage application means and thereby having the lens voltage applied to all of the electrodes E2 through E5. This creates a long accelerating-decelerating einzel lens which can provide strong focusing of the ion beam in the post-acceleration region.

SPECIFIC EMBODIMENT OF RECONFIGURATION SYSTEM

Figure 14:
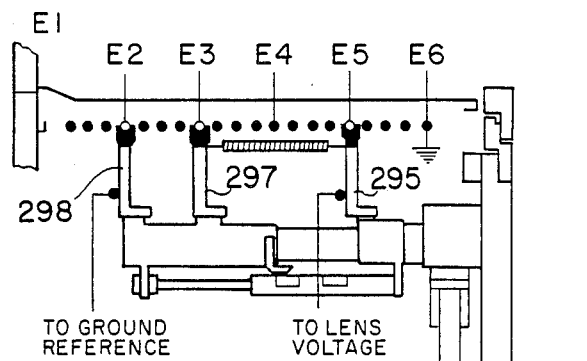
FIGS. 14–16 are diagrams illustrating a specific embodiment of a reconfiguration system forming one portion of the system and method of this invention.
Figure 15:
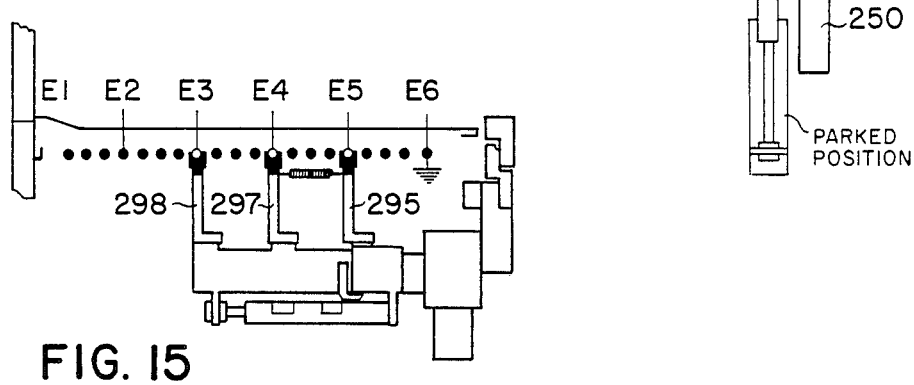
Figure 16:
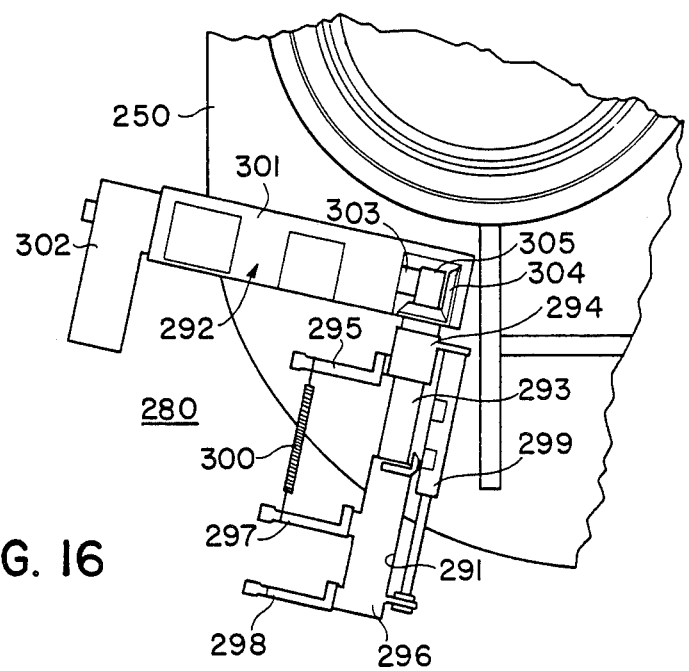

FIGS. 14–16 illustrate a specific embodiment of a reconfiguration system which includes a placement system that swings that first and second voltage application means between a parked position in which they lie parallel to the back wall of the wafer processor chamber and an active position in which they are in contact with the voltage gradient rings associated with certain electrodes. A two position system for the two voltage application means is employed so that the voltage application means can be configured to create the two einzel lens structures shown in FIGS. 11B and 11C.

The reconfiguration system 280 is shown in a plan view in the parked position in FIG. 16. It consists of a voltage application module 291 and a placement system 292. The voltage application module 291 includes a shaft 293 on which a first cylindrical bracket member 294 is mounted in a fixed position and carries a voltage application arm 295 extending radially outward from the shaft 293. A second cylindrical bracket 296 is carried on shaft 293 in a telescoping relationship so that the cylinder 299 can move the bracket 296 between the extended position shown in FIGS. 14 and 16 and the retracted position shown in FIG. 15. Bracket 296 carries two voltage application arms 297 and 298, both of which extend radially away from the shaft 293, but are at fixed axial distances from each other. Tension spring 300 is connected between the voltage application arms 295 and 297 and serves to connect them electrically and to bias the second bracket 296 toward the retracted position when cylinder 299 is not operated.

As shown in FIG. 14, when the voltage application module 291 is in the active position and the bracket 291 is in the extended position, the lens voltage is applied to the electrodes E3 and E5 through the voltage application arms 295 and 297 and ground reference potential is applied through arm 298 to electrode E2. As shown in FIG. 15, when the voltage application module is in the active position and the second bracket 291 is retracted, the lens voltage is applied through arms 295 and 297 to to electrodes E4 and E5 and ground reference is applied through arm 298 to electrode E3.

Placement system 292 is configured to provide a compound drive motion for the voltage application module 291 in moving it from a parked to an active position. This compound motion involves swinging the voltage application module through a ninety degree rotation about the axis of shaft 293 while rotating shift 293 through ninety degrees about shaft 303. This is accomplished by using a beveled worm gear arrangement 304 driven by a motor drive 302. Shaft 293 is mounted on shaft 303 by way of a coupling 305 which provides for rotation of the entire voltage application module relative to the axis of shaft 303. The shaft 293 and brackets 294 and 296 rotate with the worm gear section mounted thereon. With this compound drive motion, the voltage application arms are positioned parallel to the back wall of the wafer processor chamber and thus out of the way for doing any servicing on the post-acceleration system.

The placement system shown in FIGS. 14–16 is preferred because it removes the voltage application module out of the air gap between the terminal and the wafer processor chamber to provide the full gap therebetween for air insulation when the voltage differential is up to full 160 kV post-acceleration voltage. The length of the post-acceleration voltage gradient tube is designed to insulate this maximum post-acceleration voltage and metal structures, especially ones with ground potential thereon, must not be in that region when maximum post-acceleration voltage is applied. convenience that it provides. However, it should be understood that the invention is not limited to this type of placement system for the reconfiguration system and numerous alternative approaches could be taken.

The system and method of this invention have been described above in the context of both the general concepts and specific embodiments for purposes of illustration. It should be understood that persons of skill in the art could make any modifications of the specific teachings without departing from the scope of the invention as claimed in the followings claims.

What is claimed is:

1. In a system for post-accelerating a beam of ions between a beam input voltage and a beam destination voltage;

an electrode system having a first electrode at said beam input voltage, a last electrode at said beam destination voltage, and a set of intermediate electrodes therebetween;

means establishing a first beam acceleration mode, including first means for applying a first set of voltages to said set of intermediate electrodes to create a working beam acceleration region having a substantially linear voltage gradient;

means establishing a second beam acceleration mode, including second means for applying a second set of voltages to said set of intermediate electrodes to create a working beam acceleration region having a substantially non-linear voltage gradient to increase the beam focusing power within said working beam acceleration region; and wherein said ion beam comprises a beam of ions of a selected polarity which have been pre-accelerated to a preselected initial energy at said first electrode and are accelerated to a final energy between said first electrode and said last electrode, said set of intermediate electrodes comprises at least a single electrode, and said second set of voltages comprises at least a single voltage of greater relative beam-attracting potential than both said beam input voltage and said beam destination voltage so that said ion beam is first positively accelerated between said first electrode and said intermediate electrode to an energy greater than said final energy and then negatively accelerated between said intermediate electrode and said last electrode to said final energy.

2. In a system for post accelerating a beam of ions between a beam input voltage and a beam destination voltage;

an electrode system having a first electrode at said beam input voltage, a last electrode at said beam destination voltage, and a set of intermediate electrodes therebetween;

means establishing a first beam acceleration mode, including first means for applying a first set of voltages to said set of intermediate electrodes to create a working beam acceleration region having a substantially linear voltage gradient;

means establishing a second beam acceleration mode, including second means for applying a second set of voltages to said set of intermediate electrodes to create a working beam acceleration region having a substantially non-linear voltage gradient to increase the beam focusing power within said working beam acceleration region; and wherein said ion beam comprises a beam of positive ions which have been preaccelerated to a preselected initial energy, said beam input voltage is positive relative to said beam destination voltage so that said positive ion beam undergoes overall positive acceleration between said first and last electrodes to a final energy higher than said initial energy, and at least a subset of said second set of voltages each comprising a voltage having a value more negative than said beam destination voltage so that said positive ion beam is first positively accelerated to an energy greater than said final energy and then negatively accelerated to said final energy.

3. In a system for post-accelerating a beam of ions between a beam input voltage and a beam destination voltage;
- an electrode system having a first electrode at said beam input voltage, a last electrode at said beam destination voltage, and a set of intermediate electrodes therebetween;
- means establishing a first beam acceleration mode, including first means for applying a first set of voltages to said set of intermediate electrodes to create a working beam acceleration region having a substantially linear voltage gradient;
- means establishing a second beam acceleration mode, including second means for applying a second set of voltages to said set of intermediate electrodes to create a working beam acceleration region having a substantially non-linear voltage gradient to increase the beam focusing power within said working beam acceleration region; and
- wherein said ion beam comprises a beam of positive beam ions pre-accelerated to a preselected initial energy, said beam input voltage is negative relative to said beam input destination voltage so that said positive ion beam undergoes overall negative acceleration between said first and last electrodes to a final energy less than said initial energy, and at least a subset of said second set of voltages each comprises a voltage having a value more negative than said beam input voltage so that said positive ion beam is first positively accelerated to an energy greater than said initial energy and then negatively accelerated to said final energy.

4. In a method for post-accelerating a beam of ions between a beam input voltage and a beam destination voltage with plural modes of focusing of said beam, the steps of:
- disposing in the path of said beam a first electrode, a last electrode and a set of intermediate electrodes to define a working beam acceleration region between said first and last electrodes;
- applying said beam input voltage to said first electrode;
- applying said beam destination voltage to said last electrode;
- applying a first set of voltages to said set of intermediate electrodes during a first of said modes to create a substantially linear voltage gradient in said working beam acceleration region; and
- applying a second set of voltages to said intermediate electrodes during a second of said modes to create a substantially non-linear voltage gradient in said working beam acceleration region; and
- wherein said ion beam is a positive ion beam pre-accelerated to a preselected initial energy, said step of applying said beam input voltage comprises applying a voltage which is more positive than said beam destination voltage so that said positive ion beam undergoes positive acceleration between said first and last electrodes to a final energy higher than said initial energy; and said step of applying said second set of voltages comprises applying to at least a subset of said intermediate electrodes a subset of voltages each more negative than said beam destination voltage so that said positive ion beam first undergoes positive acceleration to an energy higher than said final energy and then undergoes negative acceleration to said final energy.

5. In a method for post-accelerating a beam of ions between a beam input voltage and a beam destination voltage with plural modes of focusing of said beam, the steps of:
- disposing in the path of said beam a first electrode, a last electrode and a set of intermediate electrodes to define a working beam acceleration region between said first and last electrodes;
- applying said beam input voltage to said first electrode;
- applying said beam destination voltage to said last electrode;
- applying a first set of voltages to said set of intermediate electrodes during a first of said modes to create a substantially linear voltage gradient in said working beam acceleration region; and
- applying a second set of voltages to said intermediate electrodes during a second of said modes to create a substantially non-linear voltage gradient in said working beam acceleration region; and
- wherein said ion beam is a positive ion beam pre-accelerated to a preselected initial energy, said step of applying said beam input voltage comprises applying a voltage which is more negative than said beam input voltage so that said positive ion beam undergoes negative acceleration between said first and last electrodes to a final energy lower than said initial energy, and said step of applying said second set of voltages comprises applying a subset of voltages each more negative than said beam origin voltage so that said positive ion beam first undergoes positive acceleration to an energy higher than said initial energy and then undergoes negative acceleration to said final energy.

6. In an ion beam post-acceleration system,
- an electrode system including a terminal electrode, a destination electrode, and a set of intermediate electrodes defining a working beam acceleration region between said terminal and destination electrodes;
- first power supply means for supplying a beam input voltage to said terminal electrode and a reference voltage to said destination electrode;
- a voltage gradient tube disposed over said electrode system and formed of electrically insulating material,
- a substantial number of spaced voltage gradient rings disposed on said voltage gradient tube,
- a voltage dividing resistor chain connected on one end to said terminal electrode and on the other end to said destination electrode and at intermediate points to said voltage gradient rings;
- a set of electrical connections for connecting each electrode in said set of intermediate electrodes to one of said voltage gradient rings;
- a terminal shorting bar means selectably actuatable during a first operating mode of said post acceleration system for shorting together said terminal electrode and a selectable set of said voltage gradient rings to select an active set of said electrodes to be deployed in accelerating said beam and to provide a substantially linear voltage gradient thereacross; and a reconfiguration system selectably actuatable during a second operating mode of said post acceleration system to convert said electrodes into a combined beam acceleration and converging lens system, said reconfiguration system comprising second power supply means for supplying a direct current lens voltage having a magnitude substantially different from both of said reference voltage and said beam input voltage; and a voltage application system including at least a first voltage application means for applying said lens voltage to at least one of said voltage gradient rings to provide a substantially non-linear voltage gradient across said electrode system.

7. The system of claim 6, wherein said ion beam has a preselected initial energy at said terminal electrode and is accelerated to a final energy between said terminal electrode and said destination electrode, said set of intermediate electrodes comprises a single electrode, and said first voltage application means applies said lens voltage to said intermediate electrode, said lens voltage having a value more negative than both said beam input voltage and said beam destination voltage so that said ion beam is first positively accelerated between said terminal electrode and said intermediate electrode to an energy greater than said initial energy and then negatively accelerated between said intermediate electrode and said destination electrode to said final energy.

8. The system of claim 6, wherein said ion beam comprises a beam of positive ions which have been pre-accelerated to a preselected initial energy at said terminal electrode, said beam input voltage is positive relative to said reference voltage so that said positive ion beam undergoes overall positive acceleration between said terminal electrode and said destination electrode to a final energy higher than said initial energy, and said lens voltage comprises a voltage having a value more negative than said reference voltage so that said positive ion beam is first positively accelerated to an energy greater than said final energy and then negatively accelerated to said final energy.

9. The system of claim 6, wherein said ion beam comprises a beam of positive ions pre-accelerated to a preselected initial energy at said terminal electrode, said beam input voltage relative to said beam destination voltage so that said positive ion beam undergoes negative acceleration between said terminal electrode and said destination electrode to a final energy less than said initial energy, and said lens voltage comprises a voltage having a value more negative than said beam input voltage so that said positive ion beam is first positively accelerated to an energy greater than said initial energy and then negatively accelerated to said final energy.

10. The system of claim 6, wherein said set of intermediate electrodes comprises at least two electrodes, and said voltage application system includes a second voltage application means for applying said reference voltage to one of said voltage gradient rings upstream of said first voltage application means for defining a beam acceleration region followed by a beam focusing region.

11. The system of claim 10, further comprising means for varying the positions of said first and second voltage application means and thereby varying the respective lengths of said beam acceleration region and said beam focusing region.

12. The system of claim 10, wherein said set of intermediate electrodes comprises at least three spaced electrodes and said reconfiguration system is arranged to configure said electrode system in two different configurations:

a first configuration wherein said second voltage means connects said reference voltage to the first one of said intermediate electrodes to provide acceleration of said ion beam across a single electrode gap; and said first voltage application means couples said lens voltage to at least one of said voltage gradient rings downstream of the position of said first voltage application means to create a converging lens system between said first intermediate electrode and said destination electrode; and a second configuration wherein said second voltage application means connects said reference voltage to the voltage gradient ring connected to the second one of said intermediate electrodes to provide acceleration of said ion beam across two electrode gaps; and said first voltage c means connects said lens voltage to at least one of said voltage gradient rings downstream of said first voltage application means to create a converging lens system between said second intermediate electrode and said destination electrode.

13. The system of claim 10, wherein said set of intermediate electrodes consists of four electrodes; said lens voltage is less than or equal to the maximum voltage differential which can be applied between two of said electrodes, and said reconfiguration system is arranged to configure said electrode system in two different configurations:

a first configuration wherein said second voltage application means connects said reference voltage to the voltage gradient ring connected to the first one of said intermediate electrodes to provide acceleration of said ion beam across a single electrode gap; and said first voltage application means connects said lens voltage to the voltage gradient rings associated with second and fourth ones of said intermediate electrodes to create an einzel lens system between said first intermediate electrode and said destination electrode; and a second configuration wherein said second voltage application means connects said reference voltage to the voltage gradient ring connected to the second one of said intermediate electrodes to provide acceleration of said ion beam across two electrode gaps; and said first voltage application means connects said lens voltage to the voltage gradient rings connected to the third and fourth ones of said intermediate electrodes to create a converging lens system between the second intermediate electrode and said destination electrode.

14. The system of claim 6, wherein said terminal shorting bar means and said reconfiguration system means for both actuatable during a third operating mode of said acceleration system to configure said system for zero acceleration of said ion beam but with substantial focusing of said beam in a converging lens system, said terminal shorting bar means being connected to the voltage gradient ring connected to said first intermediate electrode and said reconfiguration system having said second voltage application means applying said reference voltage to the same voltage gradient ring to connect said reference voltage to said terminal electrode.

15. In an ion implantation system, a terminal, an ion beam source system mounted within said terminal and being biased relative to said terminal to a selectable preanalysis accelerating voltage for producing an ion beam having energy corresponding to said preanalysis accelerating voltage and a selectable current magnitude, a beam analysis system mounted within said terminal and including an analysis magnet system for producing an analyzed ion beam, and and a beam resolving slit mounted within said terminal downstream of said analysis magnet system for producing a resolved ion beam of a selected mass species exiting said resolving slit, a target wafer chamber including means for positioning a target wafer in the path of said resolved ion beam, and a post acceleration system mounted external to said terminal and being disposed in a post acceleration region between said resolving slit and said target wafer for accelerating said resolved ion beam to a selectable final beam energy while maintaining adequate ion beam focus for all conditions of beam perveance in said post acceleration system, said post acceleration system comprising an electrode system including a terminal electrode connected to said terminal, a destination electrode, and a set of intermediate electrodes defining a maximum working beam acceleration region between said terminal electrode and said destination electrode;

first power supply means for supplying a beam acceleration voltage to said terminal electrode and a reference voltage to said destination electrode;

a voltage gradient tube disposed over said electrode system between said terminal and said target wafer chamber and being formed of electrically insulating material, a substantial number of spaced voltage gradient rings disposed on said voltage gradient tube, a voltage dividing resistor chain connected on one end to said terminal electrode and on the other end to said destination electrode and at intermediate points to said voltage gradient rings;

a set of electrical connections for connecting each electrode in said set of intermediate electrodes to one of said voltage gradient rings;

a terminal shorting bar means selectably actuatable during a first operating mode of said post acceleration system for shorting together said terminal electrode and a selectable set of said voltage gradient rings to select an active set of said electrodes to be deployed in accelerating said beam and to provide a substantially linear voltage gradient thereacross; and a reconfiguration system selectably actuatable during a second operating mode of said post acceleration system to convert said electrodes into a combined beam acceleration and converging lens system, said reconfiguration system comprising second power supply means for supplying a direct current lens voltage having a magnitude substantially different from both of said reference voltage and said beam origin voltage; and a voltage application system including at least a first voltage application means for applying said lens voltage to at least one of said voltage gradient rings to provide a substantially non-linear voltage gradient across said electrode system.

16. The system of claim 15, wherein said ion beam has a preselected initial energy at said terminal electrode and is accelerated to a final energy between said terminal electrode and said destination electrode, said set of intermediate electrodes comprises a single electrode, and said first voltage application means applies said lens voltage to said intermediate electrode, said lens voltage having a value more negative than both said beam input voltage and said beam destination voltage so that said ion beam is first positively accelerated between said terminal electrode and said intermediate electrode to an energy greater than said initial energy and then negatively accelerated between said intermediate electrode and said destination electrode to said final energy.

17. The system of claim 15, wherein said ion beam comprises a beam of positive ions which have been pre-accelerated to a preselected initial energy at said terminal electrode, said beam input voltage is positive relative to said reference voltage so that said positive ion beam undergoes overall positive acceleration between said terminal electrode and said destination electrode to a final energy higher than said initial energy, and said lens voltage comprises a voltage having a value more negative than said reference voltage so that said positive ion beam is first positively accelerated to an energy greater than said final energy and then negatively accelerated to said final energy.

18. The system of claim 15, wherein said ion beam comprises a beam of positive ions pre-accelerated to a preselected initial energy at said terminal electrode, said beam input voltage is negative relative to said beam destination voltage so that said positive ion beam undergoes negative acceleration between said terminal electrode and said destination electrode to a final energy less than said initial energy, and said lens voltage comprises a voltage having a value more negative than said beam input voltage so that said positive ion beam is first positively accelerated to an energy greater than said initial energy and then negatively accelerated to said final energy.

19. The system of claim 15, wherein said set of intermediate electrodes comprises at least two electrodes, and said voltage application system includes a second voltage application means for applying said reference voltage to one of said voltage gradient rings upstream of said first voltage application means for defining a beam acceleration region followed by a beam focusing region.

20. The system of claim 19, further comprising means for varying the positions of said first and second voltage application means and thereby varying the respective lengths of said beam acceleration region and said beam focusing region.

21. The system of claim 19, wherein said set of intermediate electrodes comprises at least three spaced electrodes and said reconfiguration system is arranged electrodes and said electrode system in two different configurations:

a first configuration wherein said second voltage c means connects said reference voltage to the first one of said intermediate electrodes to provide acceleration of said ion beam across a single electrode gap; and said first voltage application means couples said lens voltage to at least one of said voltage gradient rings downstream of the position of said first voltage application means to create a converging lens system between said first intermediate electrode and said destination electrode; and a second configuration wherein said second voltage application means connects said reference voltage to the voltage gradient ring connected to the second one of said intermediate electrodes to provide acceleration of said ion beam across two electrode gaps; and said first voltage c means connects said lens voltage to at least one of said voltage gradient rings downstream of said first voltage application means to create a converging lens system between said second intermediate electrode and said destination electrode.

22. The system of claim 19, wherein said set of intermediate electrodes consists of four electrodes; said lens voltage is less than or equal to the maximum voltage differential which can be applied between two of said electrodes, and said reconfiguration system is arranged to configure said electrode system in two different configurations:

a first configuration wherein said second voltage application means connects said reference voltage to the voltage gradient ring connected to the first one of said intermediate electrodes to provide acceleration of said ion beam across a single electrode gap; and said first voltage application means connects said lens voltage to the voltage gradient rings associated with second and fourth ones of said intermediate electrodes to create an einzel lens system between said first intermediate electrode and said destination electrode; and a second configuration wherein said second voltage application means connects said reference voltage to the voltage gradient ring connected to the second one of said intermediate electrodes to provide acceleration of said ion beam across two electrode gaps; and said first voltage application means connects said lens voltage to the voltage gradient rings connected to the third and fourth ones of said intermediate electrodes to create a converging lens system between the second intermediate electrode and said destination electrode.

23. The system of claim 15, wherein said terminal shorting bar means and said reconfiguration system means are both actuatable during a third operating mode of said acceleration system to configure said system for zero acceleration of said ion beam but with substantial focusing of said beam in a converging lens system, said terminal shorting bar means being connected to the voltage gradient ring connected to said first intermediate electrode and said reconfiguration system having said second voltage application means applying said reference voltage to the same voltage gradient ring to connect said reference voltage to said terminal electrode.

* * * * *

UNITED STATES PATENT AND TRADEMARK OFFICE
CERTIFICATE OF CORRECTION

PATENT NO. : 4,782,304
DATED : November 1, 1988
INVENTOR(S) : DEREK AITKEN

It is certified that error appears in the above—identified patent and that said Letters Patent is hereby corrected as shown below:

IN THE SPECIFICATION

In Col. 1, in the title "SYSTEMS AND...", correct the spelling of "METHDS" to --METHODS--;

In Col. 4, line 61, change "not" to --no--;

In Col. 17, line 22, change "27" to --270--; and

In Col. 20, lines 4 and 5, change "configuration" to --reconfiguration--.

IN THE CLAIMS

In Claim 2, Col. 23, line 6, change "each comprising" to --each comprises--;

In Claim 3, Col. 23, line 32, delete "beam"; same claim, same column, line 34, delete "input";

In Claim 9, Col. 25, line 50, after "voltage" insert --is negative--;

In Claim 14, Col. 26, line 61, delete "for" and insert --are--;

UNITED STATES PATENT AND TRADEMARK OFFICE
CERTIFICATE OF CORRECTION

PATENT NO. : 4,782,304
DATED : November 1, 1988
INVENTOR(S) : DEREK AITKEN

It is certified that error appears in the above—identified patent and that said Letters Patent is hereby corrected as shown below:

In Claim 21, Col. 28, lines 58 and 59, after "system is arranged", delete "electrodes and" and insert --to configure--.

Signed and Sealed this

Sixteenth Day of May, 1989

Attest:

DONALD J. QUIGG

*Attesting Officer*  *Commissioner of Patents and Trademarks*